(12) United States Patent
Sheafor

(10) Patent No.: US 9,703,313 B2
(45) Date of Patent: Jul. 11, 2017

(54) PERIPHERAL CLOCK MANAGEMENT

(71) Applicant: Ambiq Micro, Inc., Austin, TX (US)

(72) Inventor: Stephen James Sheafor, Boulder, CO (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 14/855,105

(22) Filed: Sep. 15, 2015

(65) Prior Publication Data

US 2016/0109898 A1    Apr. 21, 2016

Related U.S. Application Data

(60) Provisional application No. 62/066,218, filed on Oct. 20, 2014.

(51) Int. Cl.

| | | |
|---|---|---|
| G06F 1/06 | (2006.01) | |
| G06F 1/12 | (2006.01) | |
| G05F 1/56 | (2006.01) | |
| H03K 17/687 | (2006.01) | |
| H03M 1/12 | (2006.01) | |
| H03L 7/00 | (2006.01) | |
| G06F 11/30 | (2006.01) | |
| G06F 11/34 | (2006.01) | |
| G06F 13/10 | (2006.01) | |
| G01R 19/00 | (2006.01) | |
| G06F 1/32 | (2006.01) | |

(52) U.S. Cl.
CPC ............ G06F 1/06 (2013.01); G01R 19/0084 (2013.01); G05F 1/56 (2013.01); G06F 1/12 (2013.01); G06F 1/3237 (2013.01); G06F 1/3287 (2013.01); G06F 11/3041 (2013.01); G06F 11/3414 (2013.01); G06F 13/102 (2013.01); H03K 17/687 (2013.01); H03L 7/00 (2013.01); H03M 1/12 (2013.01); Y02B 60/1228 (2013.01)

(58) Field of Classification Search
CPC .. G06F 1/00; G06F 1/10; G11C 19/00; G11C 19/28; G11C 19/34; G11C 7/00; G11C 7/22; H03K 5/00; H03K 5/135; H03L 7/00; H03L 7/0812; H03M 9/00
USPC ........................................................ 327/141
See application file for complete search history.

(56) References Cited

U.S. PATENT DOCUMENTS

| | | | |
|---|---|---|---|
| 6,052,792 | A | 4/2000 | Mensch et al. |
| 7,362,188 | B2 | 4/2008 | Leclercq |
| 2001/0007113 | A1 | 7/2001 | Shay |
| 2008/0077818 | A1* | 3/2008 | Rauschmayer ........... G06F 1/04 713/400 |
| 2012/0066432 | A1* | 3/2012 | Miura .................... G06F 13/161 711/102 |

* cited by examiner

*Primary Examiner* — Lincoln Donovan
*Assistant Examiner* — David Mattison
(74) *Attorney, Agent, or Firm* — Jeffrey Van Myers; Artie A. Pennington

(57) ABSTRACT

A clock generator for use in an electronic system comprising an integrated circuit such as a microcontroller. A plurality of oscillators are selectively enabled to produce a respective plurality of oscillator signals. For each of a plurality of clock outputs, a mux selects a respective one of the oscillator signals in response to a respective select signal provided by a clocked facility. The selected oscillator signal is gated out as the respective clock signal in response to a respective gate signal also provided by the clocked facility.

11 Claims, 3 Drawing Sheets

PERIPHERAL CLOCK MANAGEMENT

CROSS REFERENCE TO RELATED APPLICATIONS

This application is related to the following:
1. Provisional Application Ser. No. 62/066,218, filed 20 Oct. 2014 ("Parent Provisional"); and
2. PCT application Ser. No. 15/516,883, filed simultaneously herewith ("Related Application").

This application claims priority to the Parent Provisional, and hereby claims benefit of the filing date thereof pursuant to 37 CFR §1.78(a)(4).

The subject matter of the Parent Provisional and the Related Application, each in its entirety, is expressly incorporated herein by reference.

BACKGROUND OF THE INVENTION

1. Field of the Invention

The present invention relates to a method and apparatus for managing peripheral clocks.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Shown in FIG. 1 is a typical general purpose computer system 10. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery-powered mobile systems, such as smart-phones and the like, many of the discrete components typical of desktop or laptop devices illustrated in FIG. 1 are integrated into a single integrated circuit chip. The Related Application 1 discloses several circuits adapted to operate in the sub-threshold domain.

Shown by way of example in FIG. 2 is a typical single-chip microcontroller unit ("MCU") 12 comprising: a central processing unit ("CPU") 14; at least one random-access memory ("RAM") facility 16; at least one Flash memory ("Flash") facility 18; one or more timers ("Timers") 20; at least one input/output master ("I/O Master") facility 22; at least one input/output slave ("I/O Slave") facility 24; at least one analog to digital converter ("ADC") facility 26; a power management unit ("PMU") 28; and a clock generator ("Clock Generator") facility 30. A system bus ("System Bus") 32 interconnects the several MCU facilities 14-30, and a clock distribution bus ("Clock Bus") 34 distributes all clock signals developed by the Clock Generator 30 to the respective clocked facilities. As is known, development of the several clocks is generally controlled by information written to one or more control registers within Clock Generator 30 via the System Bus 32, and by system power state information typically provided by the PMU 28.

A typical prior art Clock Generator 30, as illustrated in FIG. 3, includes several oscillators, $OSC_1$ to $OSC_n$, and develops a number of clocks, $Clock_1$ to $Clock_m$, for the system facilities 14-28. In a typical MCU 12, there will be a relatively small number n of oscillators, e.g., from 2 to 5, and a relatively larger number m of clocks generated, e.g., from 5 to 20. During normal operation, a control ("Control") facility 36 selects as the source of each clock one of the oscillators via a respective one of m multiplexors ("MUXs"); and in some cases may include a divider of the oscillator output. Depending on the requirement of each particular clocked facility 14-28, some or all of the clocks may be gated via respective gates ("Gates") in order to reduce power. In the illustrated embodiment, each of the oscillators is adapted selectively to be enabled and disabled, providing further potential power reduction. All of the selection, gating and enabling is managed by Control 36, which may have registers which can be changed by software over the System Bus 32, and which, as in the illustrated embodiment, receives information about the system power state from the PMU 28.

As is know, the MCU 12 exists in one of several power states at any particular time, with the objective of using the least possible power at all times. These power states typically fall into two main categories: running when the processor is operating and its clock is active; and sleeping when the processor is not operating and its clock is not active. There are often different states within each category. There may be different sleeping states depending on whether the oscillator which is used to generate the CPU 14 clock is enabled or not, and different running states depending on which clocked facilities are active and, in general, current system activity.

Typically, software running on the CPU 14 initiates the transition from a "running" state to a "sleeping" state; whereas the transition from a "sleeping" state to a "running" state is typically initiated by a hardware event, most commonly the reception of an interrupt from an internal facility or an external device. Software selects between multiple different states within each power state category to determine the current "running" state and the "sleeping" state.

This architecture is straightforward in that software running on the CPU defines the power states, and therefore which oscillators and clocks are enabled at any point in time.

A challenge in the above architecture is that the particular running power states can only be changed while the CPU 14 is executing software. There are two major areas where this approach results in high power consumption:

1. The CPU 14 (which requires the memory facilities to also be running) is a major source of power consumption. Thus changes to the power states (other than the transition from the currently selected "sleeping" state to the currently selected "running" state due to an interrupt) can only occur in a high power environment.
2. In many cases an internal or external event requires a change in the power state, which requires that an interrupt be generated, the CPU 14 enters its high power, active state, and makes the desired changes to the power states (enabling or disabling an oscillator, for example), and then the CPU 14 returns the system to the "sleeping" state. This typically keeps the system in a high power state for some time.

In addition to the power implications, this prior art approach also creates functional complexity because selecting and enabling the appropriate clock for a clocked facility requires interaction with the power state functions in the Clock Generator 30. The typically requires the definition of a large number of power states with different clocks and oscillators enabled in each one. As a result, there is a tendency to leave clocks enabled as a safe default state which also contributes to higher power.

What is needed is a method and apparatus adapted selectively to develop the several system clocks while consuming less power than known prior art.

BRIEF SUMMARY OF THE INVENTION

In one embodiment, a clock management method is adapted for use in a system comprising m clocked facilities. In accordance with this method, n oscillation signals are developed. In response to receiving a select signal from each of the clocked facilities, a respective one of said n oscillation signals is selected. In response to receiving an enable signal from each of the clocked facilities, a clock signal comprising the selected oscillation signal is provided to each of the clocked facilities.

In one other embodiment, n oscillators are provided, each adapted to develop a respective one of the n oscillation signals, and, selectively enable each oscillator only in response to receiving a respective select signal from a respective clocked module. In accordance with one other embodiment, each of the n oscillators is disabled if the respective oscillation signal is not selected by a respective select signal. Preferably, when an oscillator is disabled, power can be disconnected from that oscillator.

In accordance with yet another embodiment, a non-transitory computer readable medium includes executable instructions which, when executed in a processing system, causes the processing system to perform the steps of the above method.

BRIEF DESCRIPTION OF THE SEVERAL VIEWS OF THE DRAWINGS

The several embodiments may be more fully understood by a description of certain preferred embodiments in conjunction with the attached drawings in which.

Figure 1:
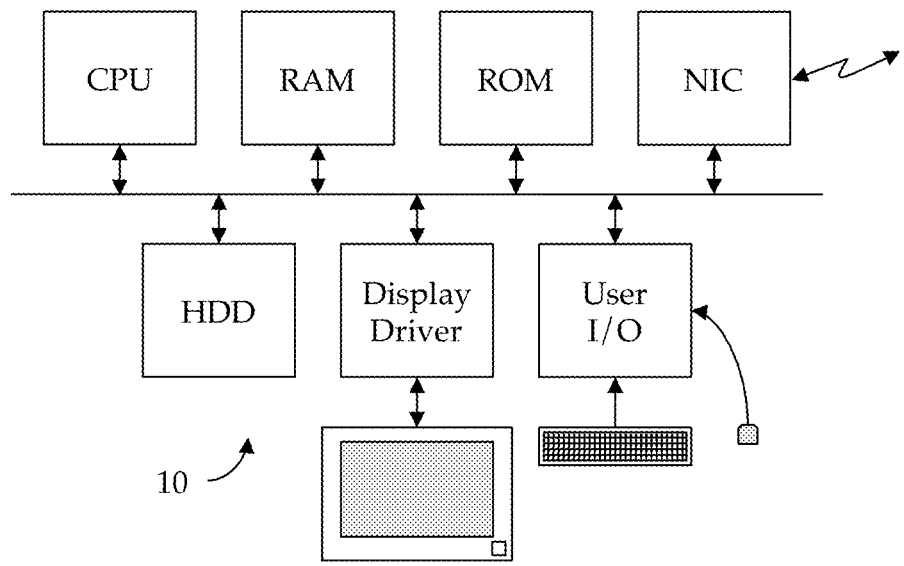
FIG. 1 illustrates, in block diagram form, a general purpose computer system adapted to instantiate any of the several embodiments.
Figure 2:
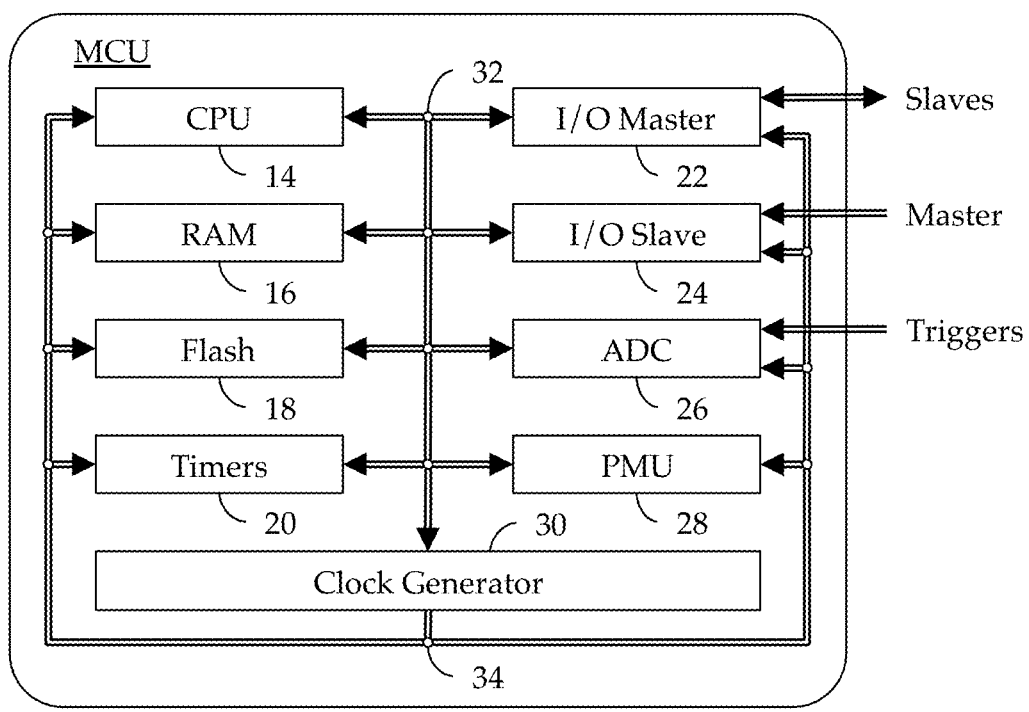
FIG. 2 illustrates, in block diagram form, a typical integrated system adapted to practice any of the several embodiments.
Figure 3:
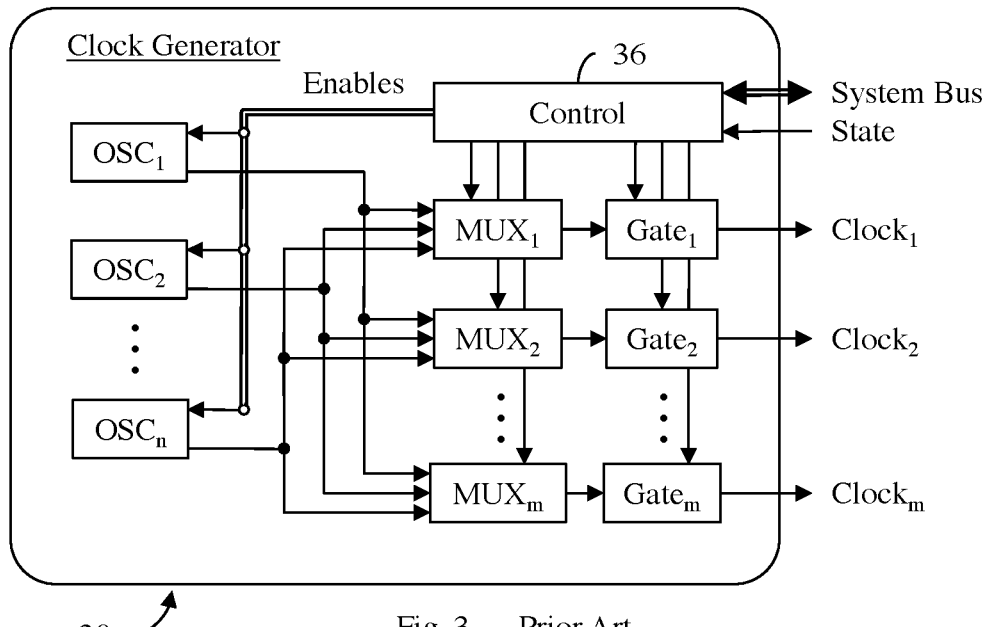
FIG. 3 illustrates, in block diagram form, a typical clock generator facility.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION OF THE INVENTION

Figure 4:
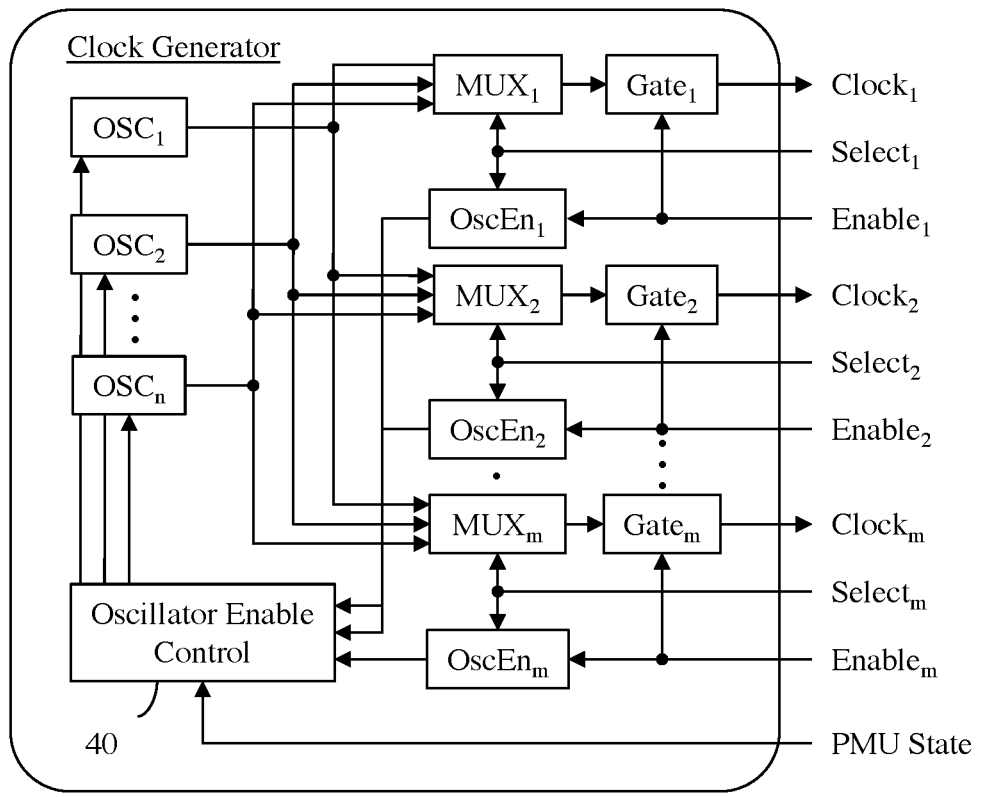
FIG. 4 illustrates, in block diagram form, one embodiment of a clock generator facility.

Shown in FIG. 4 is one embodiment of a clock generator 38 adapted to effectively and efficiently solve all of the issues discussed above with respect to the known prior art clock generators. In accordance with this embodiment, the clock select and enable signals for each clock output come from the respective clocked facility rather than a central control facility such as the control 36. These signals are combined in a simple OscEn block which identifies which oscillator OSCx (if any) is required for this clock at this time. These signals are then combined in the Oscillator Enable Control block 40 which enables each oscillator only if a clocked facility requires it. Since at least one of the clocks is for the CPU, its Enable signal (which comes from the PMU) indicates whether the overall system is "running" or "sleeping". If necessary, a simple power state indicator is received from the PMU which identifies different "sleeping" states—for example, the oscillator required for the CPU may remain enabled in a "normal sleep" mode so that the CPU can start up quickly, or may be disabled in a lower power "deep sleep" mode.

There are many common situations where this new architecture results in lower power and software simplification. Several are described below.

1. The CPU 14 sets a timer to interrupt at a point in the future and then goes into a "sleeping" state. The timer includes a clock to count for the time, and this clock may come from a variety of oscillators depending on the length of time and the accuracy required. There may also be multiple timers configured with different timing intervals and oscillators. In the prior art, each possible combination of timer oscillators requires a unique "sleeping" power state which software must manage. In accordance with one embodiment, the timer oscillator(s) are selected in the timer facility, and software simply enters the "sleeping" state. The Clock Generator 38 enables any oscillators which are required.
2. An I/O transfer is initiated with a peripheral device, at which point the CPU 14 could immediately enter a "sleeping" state. However, the I/O Master facility 22 requires a clock in order to execute the transfer, and that clock requires an oscillator. In the prior art, the CPU 14 must do one of three things:
   a. Remain in "running" mode until the I/O transfer is completed, which may result in the CPU 14 running much longer than necessary which wastes power.

b. Go into a "sleeping" state and enable wakeup via the I/O Master 22 completion interrupt. When the transfer completes, the CPU 14 enters the "running" state, modifies the oscillator configuration to disable the oscillator required by the I/O Master 22, and then go back to the "sleeping" state. The CPU 14 is thus running for a period which is necessary only to disable the I/O Master oscillator, which wastes power.

c. Go into a "sleeping" state and simply wait for the next interrupt (not the I/O Master 22 completion interrupt). This keeps the oscillator required for the I/O transfer running for much longer than necessary which wastes power.

In accordance with one embodiment, the I/O Master facility 22 disables its clock when the transfer is completed, and therefore avoids any unnecessary operation of the CPU 14. This can result in a significant power saving over any of the previous alternatives.

3. The ADC facility 26 is configured to periodically sample one or more external analog inputs based on an external asynchronous trigger. The ADC 26 requires a clock from Clock Generator 38 in order to perform the sampling, and includes local memory to hold the sampled values. It is desired to place the CPU 14 in a "sleeping" state while this sampling is occurring, as the CPU is not needed to process the samples. As in case 2), there are multiple alternatives for the CPU 14 operation in the prior art:

a. Keep the oscillator required for the ADC 26 running even in the "sleeping" power states, effectively defining a new power state. Since the ADC 26 often samples very infrequently and capturing the sample takes few clock cycles, this oscillator is therefore running much longer than necessary and wasting system power.

b. Enable an interrupt from the ADC 26 when the external trigger occurs, so that the CPU 14 can exit the "sleeping" state and enable the oscillator required by the ADC 26. This requires the CPU 14 to be in the "running" state during the entire sample time, which wastes power. Another issue with this approach is that there may be a response time requirement between the trigger and taking the sample, and the CPU 14 wakeup time might be too long to satisfy the requirement, especially is a "deep sleep" mode is selected.

In accordance with one embodiment, the oscillator required by the ADC 26 is simply enabled whenever the trigger occurs, and is disabled as soon as the sample is completed. The CPU 14 remains in the "sleeping" state throughout the operation, thus saving a significant amount of power.

4. The system is connected to an external processor using the I/O Slave facility 24. The external processor may access memory within the I/O Slave 24 at any time, and the I/O Slave 24 requires a clock to operate. It is desirable for the system to be in a "sleeping" state while waiting for the external bus master. In the prior art there are several alternatives for CPU 14 operation:

a. Keep the oscillator required for the I/O Slave 24 running even in the "sleeping" power states, effectively defining a new power state. Since the I/O Slave 24 may not be accessed by the external master, or be accessed infrequently, this oscillator is therefore running much longer than necessary and wasting system power.

b. Enable an interrupt from the I/O Slave 24 when the external access occurs, so that the CPU 14 can exit the "sleeping" state and enable the oscillator required by the I/O slave 24. The major issue with this approach is that there will be a response time requirement between the trigger and executing the I/O operation, and the CPU 14 wakeup time cannot be short enough to satisfy the requirement if the I/O interface is running at any reasonable frequency.

c. Require the external master to generate a separate interrupt on a separate signal to cause the CPU 14 to enter the "running" state so that the correct I/O Slave 24 clock and oscillator may be enabled. This requires multiple interactions between the external master and the local software which may require multiple handshake interactions, adding software complexity and wasting power.

In each of the above embodiments, these prior art issues are avoided by enabling the required oscillator when the first signal is received from the external master. This allows the external master, for example, to read and/or write several different locations within the I/O Slave 24, using different I/O operations, without ever requiring the CPU 14 to exit the "sleeping" state.

In one embodiment, the facility receiving the clock is allowed to define the default oscillator select and to enable values which are applied at power-on or after reset events. The default value may be a function of environmental conditions, for example whether there is a master device connected to the I/O Slave 24. This information cannot be available to software when a system powers up since the software has yet not begun executing, and therefore previous systems may power up in configurations which use more power than is required by enabling unnecessary oscillators. In general, the Select signals are only used when a facility may request different types of clocks, which may be different frequency divisions of the same oscillator or come from different oscillators. In those cases where only a single clock is used by a facility, that facility will assert no Select signals. For example, at any point in time each Select may be a static signal set up in advance by configuration software, while each Enable signal is a dynamic signal indicating that the respective facility is actively requesting a clock.

The function of enabling an oscillator may either remove power from the oscillator or simply gate its output while retaining power. Removing power typically provides superior power reduction when the oscillator is disabled, but requires a longer time for the oscillator to reach its correct operational state once power is restored. The Oscillator Enable Control facility 40 uses configuration signals such as the PMU State to select the optimal disabling method at any point in time for each oscillator.

Figure 5:
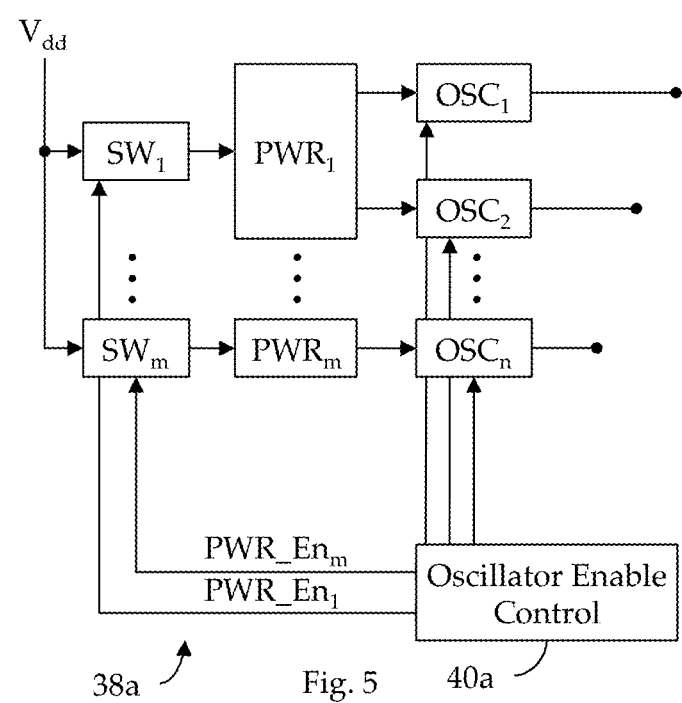
FIG. 5 illustrates, in block diagram form, a modified form of a portion of the clock generator facility shown in FIG. 4.

It is often the case that separate power supply systems, such as unique voltage regulators, are provided to control the power to the various oscillators. A modified form of a portion of the Clock Generator 38a is shown in FIG. 5, in which there are m power supply systems $PWR_1$-$PWR_m$. These systems may themselves dissipate a noticeable amount of power, and it is therefore desirable to be able to switch them off when they are not required. The switches $SW_1$-$SW_m$ controlled by enables $PWR\_En_1$-$PWR\_En_m$ accomplish this. The power supplies which must be enabled at any point in time are a function of which oscillators are enabled and whether the oscillator is powered down or simply gated when disabled. In the prior art, this enabling is typically managed by software in coordination with the oscillator enabling. In one embodiment, power supplies are enabled only when one of the oscillators they power is enabled and this function can be automatically handled based on the oscillator Enables. Thus, the time the power supplies are enabled is more optimal, further reducing overall power. The disclosed embodiments may therefore provide substantial opportunities for saving power in a number of common situations, and may also provide significant simplifications in the software required to manage internal clocks.

Although described in the context of particular embodiments, one of ordinary skill in this art will readily realize that many modifications may be made in such embodiments to adapt either to specific implementations.

Thus it is apparent that an improved method and apparatus for managing peripheral clocks has been disclosed. Further, this method and apparatus provides performance generally superior to the best prior art techniques.

What is claimed is:

1. A clock management method for use in a system comprising m clocked facilities, the method comprising the steps of:
   [1.1] developing n oscillation signals;
   [1.2] receiving a select signal from each of the clocked facilities;
   [1.3] selecting a respective one of said n oscillation signals in response to each select signal;
   [1.4] receiving an enable signal from each of the clocked facilities; and
   [1.5] providing to each of the clocked facilities a clock signal comprising the selected oscillation signal in response to a respective enable signal.

2. The method of claim 1 wherein step [1.1] is further characterized as comprising the step of:
   [1.1] selectively developing n oscillation signals.

3. The method of claim 1 wherein step [1.1] is further characterized as comprising the step of:
   [1.1] selectively developing each of n oscillation signals only in response to receiving a respective select signal.

4. The method of claim 1 wherein step [1.1] is further characterized as comprising the step of:
   [1.1] enabling each of n oscillators adapted to develop respective oscillation signals;
   the method further comprising the step of:
   [1.6] disabling each of n oscillators if the respective oscillation signal is not selected by a respective select signal.

5. A clock management method for use in a system comprising m clocked facilities, the method comprising the steps of:
   [1.1] disabling n oscillators, each adapted to develop a respective one of n oscillation signals;
   [1.2] receiving an assertion of a select signal from each of the clocked facilities;
   [1.3] enabling a respective one of said n oscillators to develop a respective oscillation signal in response to each asserted select signal;
   [1.4] receiving an assertion of an enable signal from each of the clocked facilities; and
   [1.5] providing to each of the clocked facilities a clock signal comprising the selected oscillation signal in response to the assertion of a respective enable signal.

6. The method of claim 5 further characterized as comprising the step of:
   [1.6] ceasing to provide to each of the clocked facilities said clock signal in response to a negation of said respective enable signal.

7. The method of claim 6 further characterized as comprising the step of:
   [1.7] disabling the respective one of said n oscillators in response to a negation of said respective select signal.

8. The method of claim 5 further characterized as comprising the step of:
   [1.6] disabling the respective one of said n oscillators in response to a negation of said respective select signal.

9. A clock management facility configured to perform the method of any preceding claim.

10. An electronic system comprising a clock management facility according to claim 9.

11. A non-transitory computer readable medium including executable instructions which, when executed in a processing system, causes the processing system to perform the steps of a method according to any one of claims 1 to 8.

* * * * *